(12) United States Patent
Herner et al.

(10) Patent No.: US 7,790,534 B2
(45) Date of Patent: Sep. 7, 2010

(54) METHOD TO FORM LOW-DEFECT POLYCRYSTALLINE SEMICONDUCTOR MATERIAL FOR USE IN A TRANSISTOR

(75) Inventors: S. Brad Herner, San Jose, CA (US); Christopher J. Petti, Mountain View, CA (US)

(73) Assignee: SanDisk 3D LLC, Milpitas, CA (US)

( * ) Notice: Subject to any disclaimer, the term of this patent is extended or adjusted under 35 U.S.C. 154(b) by 299 days.

(21) Appl. No.: 11/763,671

(22) Filed: Jun. 15, 2007

(65) Prior Publication Data
US 2008/0311710 A1  Dec. 18, 2008

(51) Int. Cl.
*H01L 21/00* (2006.01)
*H01L 21/84* (2006.01)

(52) U.S. Cl. .......... 438/166; 438/311; 438/378; 257/E21.412; 257/E21.372

(58) Field of Classification Search .......... 438/151, 438/166, 311, 376; 257/E21.412, E21.372, 257/64–66
See application file for complete search history.

(56) References Cited

U.S. PATENT DOCUMENTS

| | | | |
|---|---|---|---|
| 5,580,792 A | 12/1996 | Zhang et al. | |
| 5,899,741 A * | 5/1999 | Tseng et al. | 438/649 |
| 5,985,708 A | 11/1999 | Nakagawa et al. | |
| 6,177,314 B1 * | 1/2001 | Van Der Meer et al. | 438/257 |
| 6,194,255 B1 | 2/2001 | Hiroki et al. | |
| 6,558,986 B1 | 5/2003 | Choi | |
| 6,586,287 B2 | 7/2003 | Joo et al. | |
| 6,881,994 B2 | 4/2005 | Lee et al. | |
| 6,946,719 B2 | 9/2005 | Petti et al. | |
| 7,005,350 B2 | 2/2006 | Walker et al. | |
| 7,098,089 B2 | 8/2006 | Paik | |

(Continued)

FOREIGN PATENT DOCUMENTS

DE      197 10 487 A1    9/1997

OTHER PUBLICATIONS

Herner, et al., "Polysilicon Memory Switching: Electrothermal-Induced Order," IEEE Electron Device Letters, Sep. 2006, pp. 2320-2327, vol. 53, No. 9.

(Continued)

*Primary Examiner*—Alexander G Ghyka
*Assistant Examiner*—Abdulfattah Mustapha
(74) *Attorney, Agent, or Firm*—The Marbury Law Group, PLLC

(57) ABSTRACT

A method is described for forming a thin film transistor having its current-switching region in polycrystalline semiconductor material which has been crystallized in contact with titanium silicide, titanium silicide-germanide, or titanium germanide. The titanium silicide, titanium silicide-germanide, or titanium germanide is formed having feature size no more than 0.25 micron in the smallest dimension. The small feature size tends to inhibit the phase transformation from C49 to C54 phase titanium silicide. The C49 phase of titanium silicide has a very close lattice match to silicon, and thus provides a crystallization template for the silicon as it forms, allowing formation of large-grain, low-defect silicon. Titanium does not tend to migrate through the silicon during crystallization, limiting the danger of metal contamination. In preferred embodiments, the transistors thus formed may be, for example, field-effect transistors or bipolar junction transistors.

30 Claims, 6 Drawing Sheets

U.S. PATENT DOCUMENTS

| | | |
|---|---|---|
| 7,148,570 B2 | 12/2006 | Herner et al. |
| 7,176,064 B2 | 2/2007 | Herner |
| 7,195,992 B2 | 3/2007 | Gu et al. |
| 2002/0038998 A1* | 4/2002 | Fujita et al. ............... 313/495 |
| 2002/0081833 A1 | 6/2002 | Li et al. |
| 2002/0137267 A1 | 9/2002 | Joo et al. |
| 2003/0030074 A1* | 2/2003 | Walker et al. ............... 257/204 |
| 2003/0164501 A1 | 9/2003 | Suzuki et al. |
| 2003/0190777 A1 | 10/2003 | Hara et al. |
| 2004/0166655 A1 | 8/2004 | Wong et al. |
| 2004/0206996 A1* | 10/2004 | Lee et al. .................... 257/296 |
| 2005/0020006 A1 | 1/2005 | Zhang et al. |
| 2005/0226067 A1 | 10/2005 | Herner et al. |
| 2006/0172471 A1 | 8/2006 | Yamazaki et al. |
| 2007/0087508 A1 | 4/2007 | Herner |
| 2009/0176353 A1* | 7/2009 | Plummer et al. ............ 438/481 |

OTHER PUBLICATIONS

Herner, et al., "Effect of Ohmic Contacts on Polysilicon Memory Effects," Mat. Res. Soc. Sym. Proc., Mater. Res. Soc. Symp. Proc., (2005), pp. E5.6.1-E5.6.6, vol. 864.

Tiang, et al., "Twinning in TiSi2-Island Catalyzed Nanowires Grown by Gas-Source Molecular-Beam Epitaxy," Applied Physics Letters, (2002), vol. 81, No. 13.

Roy et al., "In situ x-ray diffraction analysis of the C49-C54 titanium silicide phase transformation in narrow lines," Appl. Phys. Lett., Apr. 3, 1995, 66(14):1732-1734.

\* cited by examiner

METHOD TO FORM LOW-DEFECT POLYCRYSTALLINE SEMICONDUCTOR MATERIAL FOR USE IN A TRANSISTOR

RELATED APPLICATIONS

This application is related to Petti et al., U.S. patent application Ser. No. 11/763,816, "Polycrystalline Thin Film Bipolar Transistors," and Petti et al., U.S. patent application Ser. No. 11/763,876, "Method for Forming Polycrystalline Thin Film Bipolar Transistors," both filed on even date herewith and hereby incorporated by reference in their entirety.

BACKGROUND OF THE INVENTION

In general the performance of thin film transistors is impeded by grain boundaries and crystal defects in the semiconductor material in which the current-switching region of the transistor is formed.

It is known to use metal catalysts to enhance grain size, but metals may contaminate the crystallized semiconductor material, damaging or ruining the device.

It would be advantageous to enhance grain size and reduce defects in polycrystalline semiconductor material in which the current-switching region of a thin film transistor is to be formed while preventing or limiting metal contamination.

SUMMARY OF THE PREFERRED EMBODIMENTS

The present invention is defined by the following claims, and nothing in this section should be taken as a limitation on those claims. In general, the invention is directed to a method to form polycrystalline semiconductor material having large grain size and few defects and forming a transistor having its current-switching region in the polycrystalline layer.

A first aspect of the invention provides for method for forming a current switching region in a thin film transistor, the method comprising: forming a feature comprising amorphous silicon, amorphous germanium, or amorphous silicon-germanium, said feature having a width in at least one dimension of about 0.25 microns or less; forming a titanium film on and in contact with said feature; annealing said feature and said titanium film to form titanium silicide, titanium germanide, or titanium silicide-germanide and to crystallize said amorphous silicon, said amorphous germanium, or said amorphous silicon-germanium of said feature to form polycrystalline silicon, polycrystalline germanium, or polycrystalline silicon-germanium; and forming the thin film transistor, wherein said polycrystalline silicon feature, said polycrystalline germanium feature, or said polycrystalline silicon-germanium feature comprises the current switching region of the thin film transistor.

Another aspect of the invention provides for a method for forming a monolithic three dimensional array, the method comprising: a) monolithically forming a first device level of thin film transistors above a substrate, the thin film transistors formed by a method comprising: i) forming a plurality of features comprising amorphous silicon, amorphous germanium, or amorphous silicon-germanium, each of said features having a width in at least one dimension of no more than about 0.25 microns; ii) forming a titanium film on and in contact with each of said features; iii) annealing said features and said titanium film to form titanium silicide, titanium germanide, or titanium silicide-germanide and to crystallize said amorphous silicon, said amorphous germanium, or said amorphous silicon-germanium of said features to form polycrystalline silicon, polycrystalline germanium, or polycrystalline silicon-germanium; and iv) forming the thin film transistors of the first device level, wherein each of said polycrystalline silicon features, said polycrystalline germanium features, or said polycrystalline silicon-germanium features comprises a current-switching region for one of the thin film transistors; and b) monolithically forming a second device level of thin film transistors above the first device level.

Each of the aspects and embodiments of the invention described herein can be used alone or in combination with one another.

The preferred aspects and embodiments will now be described with reference to the attached drawings.

BRIEF DESCRIPTION OF THE DRAWINGS

FIG. 3e shows the structure of FIG. 3d viewed at ninety degrees along line A-A'.

DETAILED DESCRIPTION OF THE PREFERRED EMBODIMENTS

Conventional field effect transistors typically have channel regions formed on the surface of a monocrystalline silicon wafer. The carrier mobility of the channel region strongly affects device performance, so use of high-quality monocrystalline silicon yields a high-performance device. Such devices may also be formed as thin film transistors (TFTs), wherein its channel, source, and drain regions are formed in a thin layer of semiconductor material, typically silicon, rather than on the surface of a relatively thick wafer. Furthermore, the thin film in which the TFT is formed may be an amorphous or polycrystalline semiconductor film. The channel region of such an amorphous semiconductor or polycrystalline semiconductor TFT may include grain boundaries and crystal defects which can reduce carrier mobility and/or density of carriers. Grain boundaries and crystal defects impede device performance.

The most common use of amorphous or polycrystalline semiconductor TFTs is in flat panel displays. Such devices may also be used in memory arrays. Transistors may be charge storage memory cells, as in Walker et al., U.S. Pat. No. 7,005,350, "Method for Fabricating Programmable Memory Array Structures Incorporating Series-Connected Transistor Strings, hereinafter the '350 patent; or may be formed in series with a resistivity-switching element, as in Petti et al., U.S. patent application Ser. No. 11/143,269, "Rewriteable Memory Cell Comprising a Transistor and Resistance-Switching Material in Series," filed Jun. 2, 2005, both hereby incorporated by reference. Transistors formed in thin film may also serve as switching devices, as in Petti et al. filed on even date herewith.

Figure 1:
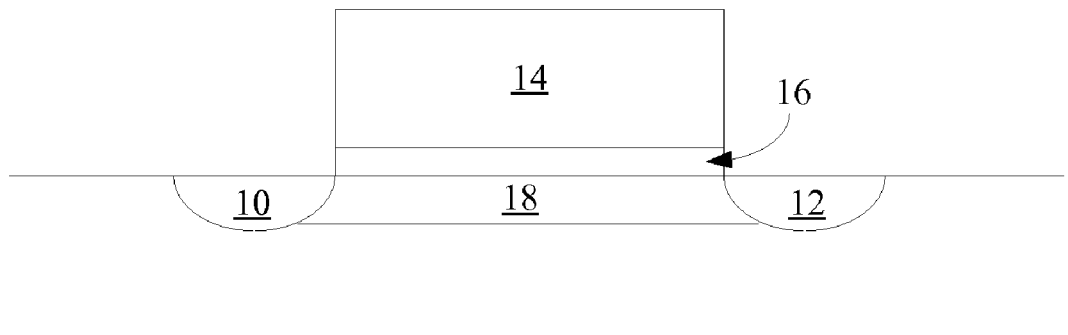
FIG. 1 is a cross-sectional view of a prior art field effect transistor.

There are several types of transistors, but in general each can be said to have a current-switching region, which is formed of semiconductor material. An external stimulus applied to the current-switching region determines whether or not the transistor will conduct current. FIG. 1, for example, shows a field-effect transistor. Such a transistor has a heavily doped source region 10, a heavily doped drain region 12, a gate electrode 14, and a gate dielectric 16. To turn the transistor on, voltage is applied to gate electrode 16, attracting charge carriers to channel region 18, which is undoped or very lightly doped, forming a conductive channel between source region 10 and drain region 12 in which current flows. In a transistor like the one shown in FIG. 1, channel region 18 is the current-switching region. The electric field induced by the gate voltage, and penetrating on or into the channel region, is the external stimulus which determines whether or not the transistor will conduct current. Device performance is strongly dependent on the quality of the semiconductor material making up channel region 18.

Figure 2:
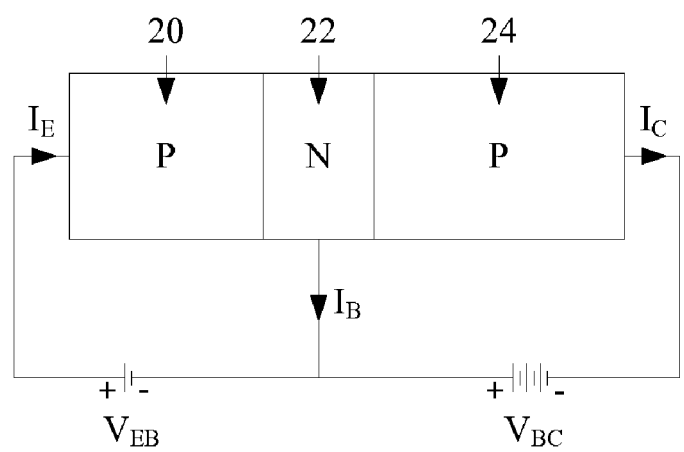
FIG. 2 is a cross-sectional view of a bipolar junction transistor.

FIG. 2 shows an idealized version of another type of transistor, a bipolar junction transistor. Such a transistor includes emitter 20, base 22, and collector 24. This example is a p-n-p bipolar transistor, in which emitter 20 and collector 24 are p-doped, while base 22 is n-doped. When a p-n-p bipolar junction transistor is biased in the forward active mode, holes are injected from emitter 20 into base 22 and flow through to collector 24. Thus in a bipolar junction transistor, the current-switching region is the base. The external stimulus that determines whether or not the transistor will conduct current is forward bias across the base-emitter junction. In such a transistor, device performance is strongly dependent on the quality of the semiconductor material making up base 22.

In general, then, the performance of a transistor depends on the quality of the semiconductor material forming its current-switching region. As described earlier, in conventional transistors, the current-switching region is formed in monocrystalline semiconductor material. A polycrystalline thin-film transistor is formed having its current-switching region in polycrystalline semiconductor material, and the performance of the transistor is improved by improving the quality of the semiconductor material. In the present invention, a method is disclosed to crystallize deposited semiconductor material having larger grain size and fewer crystal defects. The method is most effective when used with features having relatively small feature size, for example about 0.25 microns or less. A transistor is then formed having its current-switching region in the polycrystalline semiconductor material. By improving crystallinity of the semiconductor material, performance of the device is improved.

It is known to use various metals, such as nickel, cobalt, and titanium, to improve the crystallinity of deposited silicon. (Silicon is the most commonly used semiconductor material.) Different metals work to improve crystallinity by different mechanisms, however.

It is known to deposit a thin film of amorphous silicon, then deposit some amount of nickel on the silicon. During a subsequent anneal, nickel serves as a crystallization catalyst. A front of nickel, or a composite front containing Ni, advances through the silicon, leaving large-grained polycrystalline silicon, or polysilicon, behind it. In this crystallization mechanism, nickel actually travels through the silicon, and some residual amount may remain behind as a contaminant, which may adversely affect the device, or even ruin it. In a field effect transistor, for example, residual nickel in the channel will tend to create a conductive path such that the channel region is never entirely non-conductive, as desired in its off state.

Other metals, such as titanium and cobalt, can also serve to improve crystallinity of deposited silicon, but do so by a different mechanism. When a silicide-forming metal such as titanium or cobalt is in contact with amorphous silicon and is annealed, the silicon reacts with the titanium or cobalt to form titanium silicide or cobalt silicide. The silicide begins to form at a temperature which is less than the crystallization temperature of amorphous silicon. Many such silicides have a lattice structure very close to that of silicon. The silicide can behave as a template for the silicon lattice as the silicon crystallizes, causing it to form large grains having few defects such as microtwins, as described in S. B. Herner, A. Bandyopadhyay, C. Jahn, D. Kidwell, C. J. Petti, and A. J. Walker, "Polysilicon memory switching: Electrothermal-induced order," *IEEE Transactions on Electron Devices*, September, 2006, vol. 3, issue 9, pp. 2320-2327, hereby incorporated by reference. With metals such as cobalt and titanium, the silicon grows from a silicide template, the silicon crystalline/amorphous interface advancing from the original silicon/silicide interface. The metal itself does not tend to migrate through the silicon during crystallization, however. Thus the danger of metal contamination is greatly reduced, and the resulting polysilicon is suitable for use as the current-switching region of a transistor.

Titanium silicide may be in any of several crystal phases, each of which has a different lattice structure. The terminal phase, C54, is the lowest-resistivity phase, and thus is the phase most generally preferred in semiconductor devices when the titanium silicide is used as an electrical contact or as a conductor. The C49 phase of titanium silicide, however, has a better lattice match to silicon. Thus to provide a crystallization template for silicon, the C49 phase of titanium silicide is preferred. The phase transformation from C49 to C54 titanium silicide tends to emanate from grain boundary triple points, where three grains come together. At very small feature size (about 0.25 micron or less) these grain boundary triple points are rare, and the C49-to-C54 phase transformation is inhibited. In the present invention, then, titanium silicide is used to improve the quality of polysilicon at small feature size, where the C49 phase dominates. Note that the inhibition of the C49-to-C54 phase transformation at small feature size does not occur with other silicides such as cobalt silicide.

Thus far the use of titanium silicide to provide a crystallization template for polysilicon has been described. It is expected, however, that if silicon is replaced with germanium or with a silicon-germanium alloy, then titanium germanide or titanium silicide-germanide will form instead of titanium silicide, and that the titanium germanide or titanium silicide-germanide will also serve as a crystallization template, forming high-quality, low-defect polygermanium or polysilicon-polygermanium.

In general, then, in aspects of the present invention, semiconductor features of amorphous silicon, germanium, or silicon-germanium having a feature size in at least one dimension of no more than about 0.25 micron are crystallized in contact with titanium silicide, titanium germanide, or titanium silicide-germanide, forming high-quality, low-defect silicon, germanium, or silicon-germanium. A transistor is formed having its current-switching region in the low-defect silicon, germanium, or silicon-germanium.

Two embodiments will be described, though it will be understood that these embodiments are offered for illustration only, and that many other useful embodiments may be envisioned. The first embodiment describes formation of a field effect transistor having its channel region (its current-switching region) formed in deposited semiconductor material crystallized in contact with titanium silicide, titanium germanide, or titanium silicide-germanide. The second embodiment describes formation of a bipolar junction transistor having its base (its current-switching region) formed in deposited semiconductor material crystallized in contact with titanium silicide, titanium germanide, or titanium silicide-germanide. Both will be described as used in a monolithic three dimensional memory array, though it will be understood that such devices may find many other uses.

First Embodiment

Field-Effect Transistor

Figure 3A:
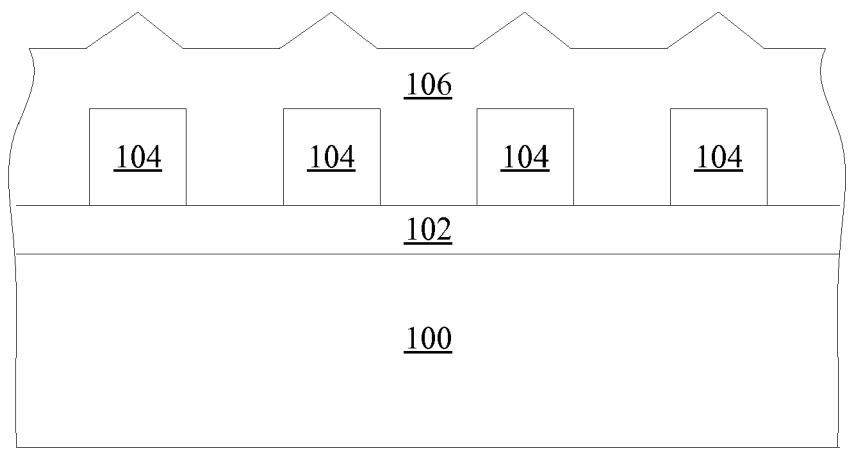
FIGS. 3a-3e are cross-sectional views showing stages in formation of a memory level comprising charge-storage transistors formed according to an embodiment of the present invention.

Turning to FIG. 3a, fabrication of the memory begins with a suitable substrate 100, for example a monocrystalline semiconductor material such as a conventional silicon wafer. An insulating layer 102 is formed over the substrate 100. Support circuitry, such as decoders and sense amplifiers, may be formed in the substrate before the memory is formed. In alternative embodiments, other substrates, such as silicon-on-insulator, glass, metal, or plastic, may be used instead.

A layer of silicon 104 is deposited on insulating layer 102 by any conventional method, for example by a chemical vapor deposition (CVD) method such as LPCVD. (For simplicity, this description will speak of the use of silicon for layer 104. It will be understood, however, that other semiconductor materials, preferably germanium or silicon-germanium alloys, may be used instead.) Silicon layer 104 may be any suitable thickness, for example between about 500 and about 4000 angstroms thick, preferably about 1000 to about 3000 angstroms thick, most preferably about 1500 angstroms thick. Silicon layer 104 may be undoped, or may be lightly doped by, for example, a p-type dopant, and may be doped in situ. Silicon layer 104 is preferably amorphous, or largely amorphous, as deposited.

As shown in FIG. 3a, silicon layer 104 is patterned and etched by any conventional method into substantially parallel channel stripes. The width of these silicon channel stripes 104 is preferably about 0.25 micron or less. A dielectric material 106 is deposited over and between silicon channel stripes 104, filling gaps between them. Any conventional dielectric fill material, such as silicon dioxide, may be used.

Figure 3B:
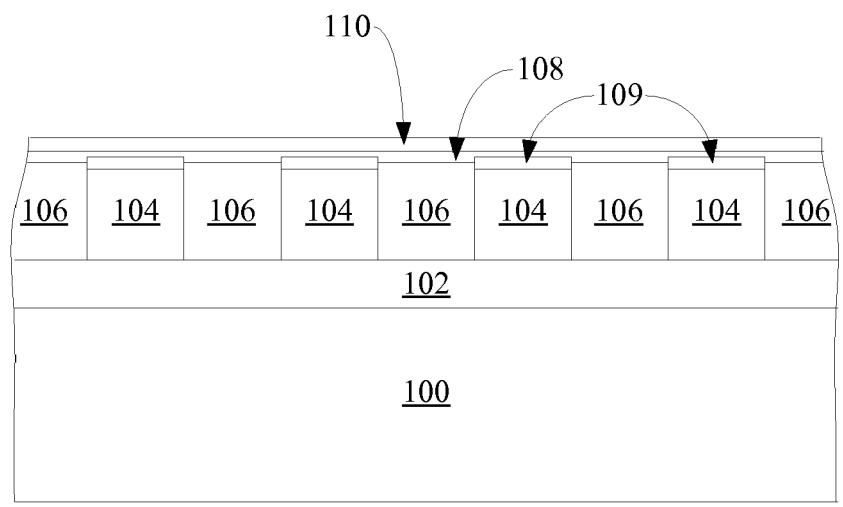

Turning to FIG. 3b, a planarization step, for example by chemical mechanical planarization (CMP) or etchback removes the overfill of dielectric material 106, coexposing silicon channel stripes 104 and dielectric 106 at a substantially planar surface. In an alternative embodiment, channel stripes 104 could have been formed by a Damascene method.

Next a layer 108 of titanium is deposited on the planar surface, contacting silicon channel stripes 104 and dielectric material 106. Titanium layer 108 is deposited to any suitable thickness, for example between about 10 and about 100 angstroms, preferably between about 20 and about 50 angstroms, most preferably about 30 angstroms. To prevent oxidation of titanium layer 108, an optional protective film, for example titanium nitride layer 110 is deposited, preferably about 300 angstroms thick. Layers 108 and 110 can be deposited by any conventional method, for example by sputtering.

A rapid thermal anneal may be performed between about 550 and about 850 degrees C. from about 10 seconds to about 120 second, preferably between about 650 and about 750 degrees C. for about 60 seconds, most preferably at about 725 degrees C. for about 60 seconds, for example in nitrogen. Alternatively, the anneal may be performed in a conventional furnace, for example at between about 550 to about 800 degrees C. from about 10 to about 60 minutes, preferably between about 650 and about 720 degrees C. for about 10 to about 60 minutes, most preferably at about 650 degrees C. for about 60 minutes. The anneal serves to react titanium layer 108 with the silicon of silicon channel stripes 104, forming titanium silicide 109. Clearly where titanium layer 108 overlies dielectric material 106, no titanium silicide is formed.

This anneal step will also serve to crystallize the silicon of silicon channel stripes 104. This crystallization takes place with the silicon in contact with titanium silicide 109. As described earlier, the small feature size of silicon channel stripes 104 inhibits the phase transformation of titanium silicide layer 109 from the C49 to the C54 phase; thus titanium silicide layer 109 will be predominantly C49 phase titanium silicide. This phase of titanium silicide has a close lattice match to silicon, and thus provides a good crystallization template for the silicon of silicon channel stripes 104; thus following this anneal, this silicon will be high-quality polysilicon, with relatively large grain size, for example 2500 angstroms or larger, and few defects.

Note that in this example the silicide reaction forming titanium silicide layer 109 and the crystallization of the silicon of silicon channel stripes 104 are performed in a single anneal step. Titanium silicide begins to form at a temperature lower than that at which large-scale crystallization of silicon begins, however. Thus when silicide layer 109 begins to form, silicon channel strips 104 are still largely amorphous, and this amorphous silicon crystallizes in contact with titanium silicide layer 109. In an alternative embodiment, it may be preferred to perform this anneal in two steps, where a first anneal at lower temperature forms the silicide, while a second anneal at higher temperature crystallizes the silicon.

Figure 3C:
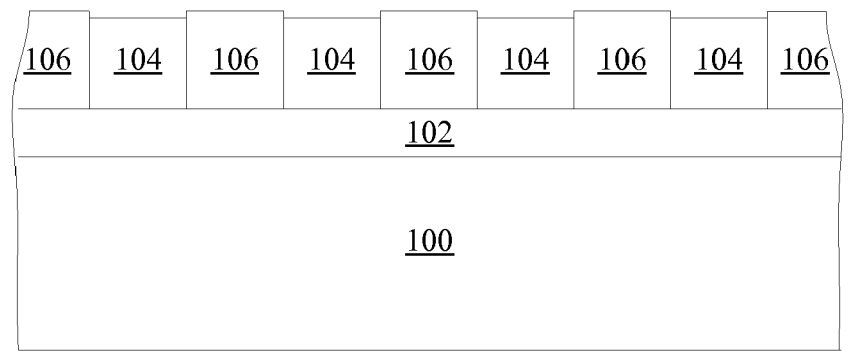

Turning to FIG. 3c, next titanium nitride layer 110 and unreacted titanium 108 are stripped in a wet etch, as is titanium silicide layer 109. Note that in this device the titanium silicide 109 must be removed to avoid shorting the channel regions in the transistors still to be formed. Some of the silicon of silicon channel stripes 104 was consumed in the reaction to form titanium silicide; thus it will be seen that silicon channel stripes 104 are recessed relative to dielectric material 106. A second planarization step, for example by CMP, is preferably performed at this point, again coexposing silicon channel stripes 104 and dielectric material 106 at a substantially planar surface, as shown in FIG. 3d.

Next a gate dielectric is formed. The present example will describe formation of a SONOS-type memory cell, which is a form of charge-storage memory cell. In such a cell, the gate dielectric includes a tunneling dielectric, a charge-storage dielectric, and a blocking dielectric.

Figure 3D:
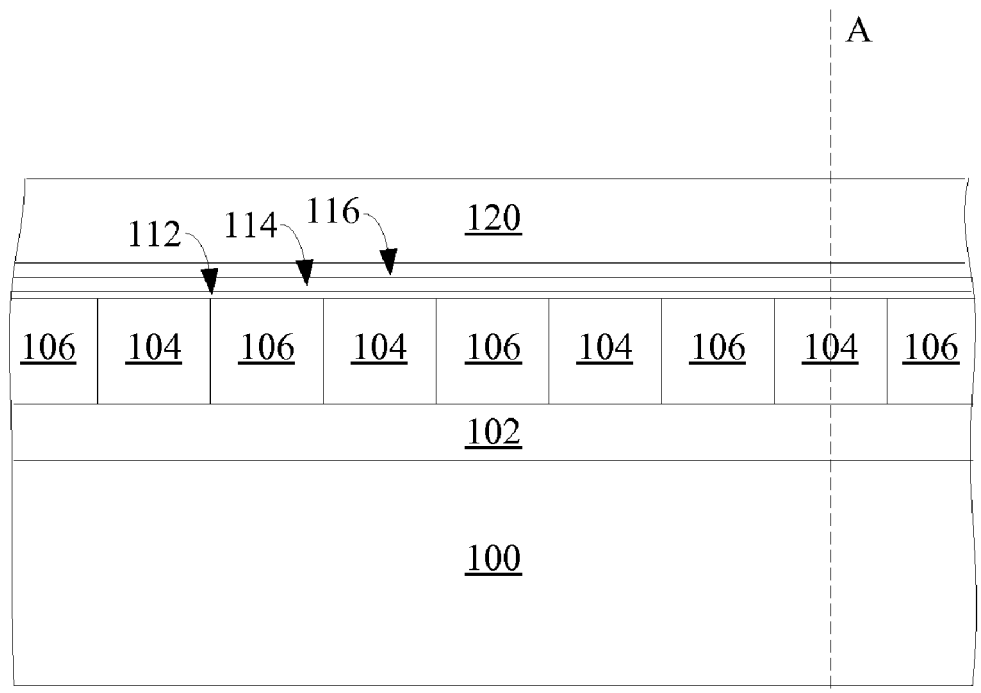

Referring to FIG. 3d, a thin tunneling dielectric 112 is formed. Tunneling dielectric 112 may be, for example, a silicon dioxide layer grown by thermal oxidation of a portion of silicon channel stripes 104. A grown oxide is typically of better quality than a deposited oxide, and will be denser with fewer defects. Next charge storage dielectric layer 114 is formed on tunneling dielectric 112. Charge storage dielectric 114 may be deposited silicon nitride ($Si_3N_4$), or any other dielectric layer or dielectric stack adapted to trap charge carriers, thus storing charge. Blocking dielectric 116 may be formed of deposited silicon dioxide. Other dielectric materials, or stacks of materials, may be used in place of the materials described for tunneling dielectric 112, charge storage dielectric 114, or blocking dielectric 116.

Figure 3E:
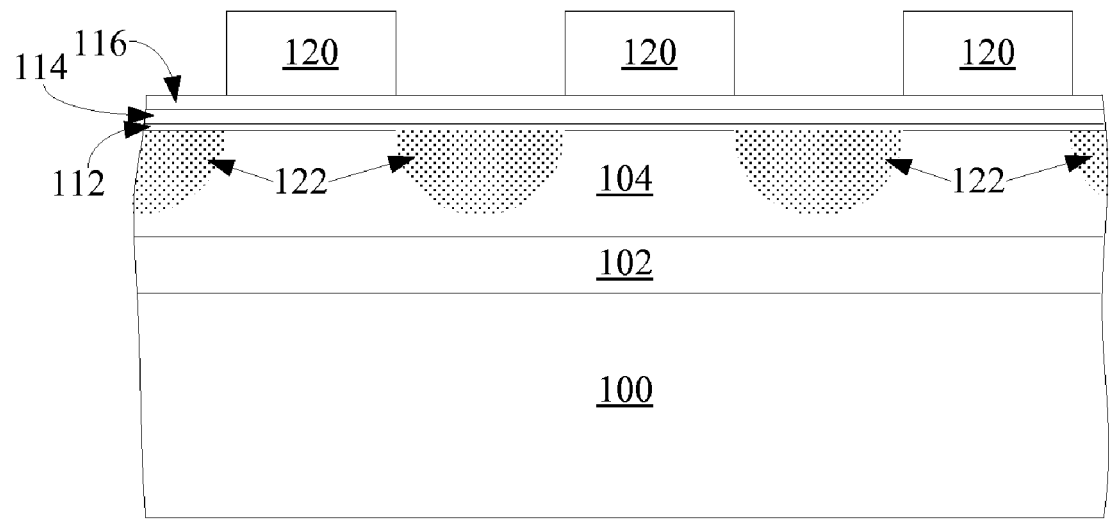

Next gate electrode layer 120 is deposited. Gate electrode layer 120 is preferably heavily doped polysilicon, but some other conductive material or stack of conductive materials may be used instead. Gate electrode layer 120 is patterned and etched to form gate stripes, which are preferably substantially perpendicular to silicon channel stripes 104. Blocking dielectric 116, charge storage dielectric 114, and tunneling dielectric 112 may be etched in the same step, but need not be. FIG. 3d shows the structure at this point, and FIG. 3e shows the same structure viewed at 90 degrees to the view of FIG. 3d rotated along line A-A'. As shown in FIG. 3e, source/drain regions 122 are formed in silicon channel stripes 104 by ion implantation. Regions 122 may be heavily doped with, for example, phosphorus or arsenic.

Fabrication of a first level of SONOS memory cells monolithically formed above a substrate has been described. In this example, the memory cells are arranged in a series-connected NAND string. A similar arrangement of memory cells in a memory array is described in Walker et al. and in Herner, U.S. patent application Ser. No. 11/077,901, "Bottom-Gate SONOS-Type Cell Having a Silicide Gate," filed Mar. 11, 2005, both hereby incorporated by reference.

FIGS. 3d and 3e show a first memory level of series-connected SONOS memory cells. As in the example just given, a typical SONOS memory cell consists of (in vertical sequence) a silicon channel region; a tunneling dielectric layer, typically silicon dioxide; a dielectric charge trapping layer, typically silicon nitride; a blocking dielectric layer, typically silicon dioxide; and a gate electrode, typically of silicon. The silicon-oxide-nitride-oxide-silicon stack gives the device its name. Other materials can replace some of these layers, however: Different dielectric materials can be used for the tunneling, charge storage, and blocking dielectric layers, and the gate electrode need not be silicon. The term "SONOS-type device" will be understood to mean a device that operates the same way a SONOS device operates, storing charge in a dielectric layer, but which is not necessarily limited to the materials conventionally used in a SONOS device.

Formation of a first memory level monolithically formed above a substrate has been described. Additional memory levels can be monolithically formed above the first, forming a monolithic three dimensional memory array. For example, dielectric material (not shown) can be deposited over the first memory level shown in FIGS. 3d and 3e, forming an interlevel dielectric. The surface of this interlevel dielectric can be planarized, for example by CMP, and fabrication of a second memory level can begin on the planarized surface.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

Figure 4:
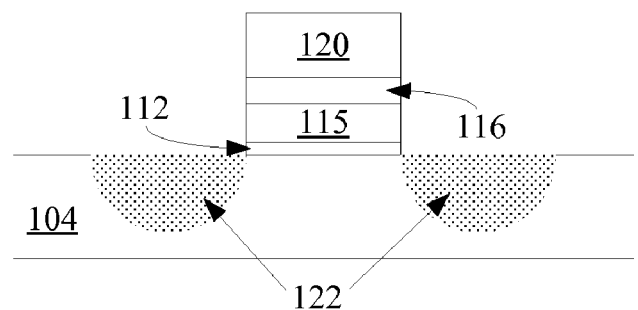
FIG. 4 is a cross-sectional view of an alternative embodiment of the present invention in which the charge-storage transistor is a floating gate transistor.

A monolithic three dimensional memory array of SONOS memory cells has been described, but this is just one of many alternative embodiments including field effect transistors having current-switching regions in deposited and crystallized semiconductor material that can be envisioned. For example, the SONOS memory cells just described can be replaced with floating gate memory cells. In a floating gate memory cell, pictured in FIG. 4, the charge storage dielectric 114 of FIGS. 3d and 3e is replaced with polysilicon floating gate 115. In such a cell, charge is stored in floating gate 15 rather than in a charge storage dielectric.

Figure 5:
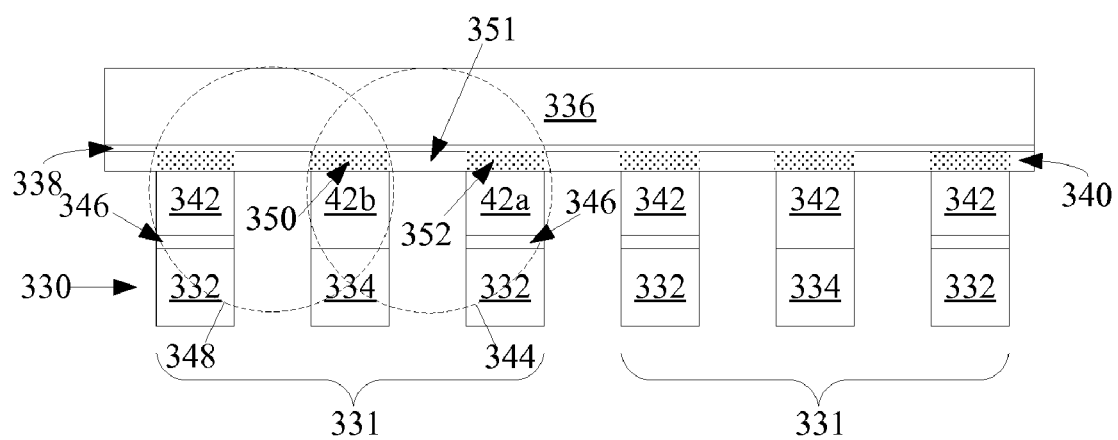
FIG. 5 is a cross-sectional view of an alternative embodiment of the present invention in which the memory cell comprises a field effect transistor in series with a resistivity-switching element.

In still another alternative embodiment, shown in FIG. 5, a memory cell comprises a field effect transistor formed in series with a resistivity-switching element. Fabrication of an array of such transistors is described in Petti et al., U.S. patent application Ser. No. 11/143,269, "Rewriteable Memory Cell Comprising a Transistor and Resistance-Switching Material in Series," filed Jun. 2, 2005, and hereby incorporated by reference.

Referring to FIG. 5, substantially parallel rails 330 (shown in cross section, extending out of the page) include a plurality of line sets 331, each line set 331 consisting of two data lines 332 and one reference line 334, reference line 334 immediately adjacent to and between the two data lines 332. Above the rails 330 and preferably extending perpendicular to them are substantially parallel select lines 336. Select lines 336 are coextensive with gate dielectric layer 338 and channel layer 340. The memory level includes pillars 342, each pillar 342 vertically disposed between one of the channel layers 340 and one of the data lines 332 or one of the reference lines 334. Transistors are formed comprising adjacent pillars along the same select line. Transistor 344 includes channel region 351 between source region 350 and drain region 352. One pillar 342a includes resistance-switching element 346, while the other pillar 342b does not. In this embodiment, adjacent transistors share a reference line; for example transistor 348 shares a reference line 334 with transistor 344. No transistor exists between adjacent data lines 332. In one embodiment, channel layer 340 can be formed of silicon crystallized in contact with titanium silicide according to methods of the present invention.

Channel layer 340 can be crystallized in contact with titanium silicide, titanium germanide, or titanium silicide-germanide as in the present invention, and may be formed having a minimum feature size of 0.25 micron or less such that channel layer 340, which comprises semiconductor material such as silicon, germanium, or silicon-germanium, will be large-grain and low-defect when crystallized.

Second Embodiment

Bipolar Junction Transistor

An alternative embodiment will be described in which a bipolar junction transistor is formed having its base in deposited silicon crystallized in contact with a silicide, preferably titanium silicide. In the example to be described, the bipolar junction transistors serve as switching elements in a monolithic three dimensional memory array in which each memory cell comprises a vertically oriented p-i-n diode paired with a dielectric rupture antifuse. Fabrication of an array of such memory cells is described in Herner, U.S. patent application Ser. No. 11/560,283, "Method for Making a P-I-N Diode Crystallized Adjacent to a Silicide in Series with A Dielectric Antifuse," filed Nov. 15, 2006 and hereby incorporated by reference. Fabrication of this array including bipolar junction transistors as switching devices is described in more detail in Petti et al., the related application filed on even date herewith. To avoid obscuring the invention, not all of the details of these applications will be included, but it will be understood that no teaching is intended to be excluded.

Figure 6A:
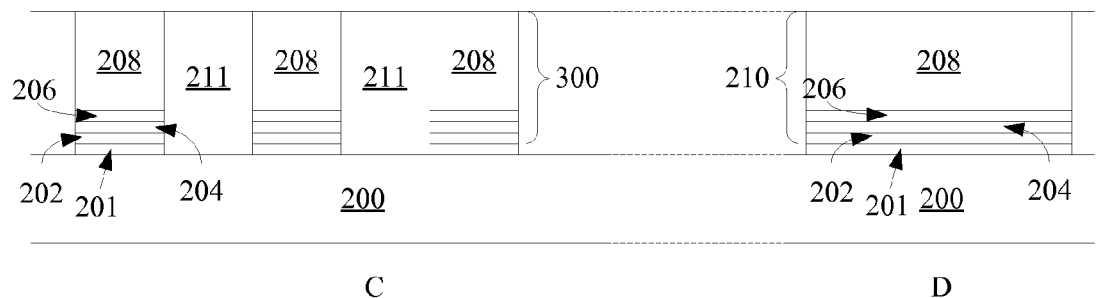
FIGS. 6a-6c are cross-sectional views showing stages in formation of a memory level in which switching elements are bipolar junction transistors formed according to an embodiment of the present invention.

Turning to FIG. 6a, rail-shaped conductor 200 is shown in cross-section, extending left-to-right across the page. Conductor 200 is one of a plurality of substantially parallel, substantially coplanar conductors, and is formed of suitable conductive materials, for example tungsten with titanium nitride as an adhesion layer. Conductors 200 are preferably formed by a Damascene method; thus the space between them is filled with dielectric material (not shown), with the dielectric material and conductors 200 exposed at a substantially planar surface. Area C is within the array, while area D is at the edge of the array. Some distance may separate areas C and D, as indicated by dashed lines.

Optional barrier layer 201, for example of titanium nitride, is formed on the planar surface, followed by dielectric rupture antifuse 202, preferably of a high-K dielectric such as $HfO_2$ or $Al_2O_3$. Optional barrier layer 204, for example of titanium nitride, is formed on dielectric rupture antifuse 202. A layer 206 of heavily doped silicon, for example doped in situ by an n-type dopant such as phosphorus, is deposited on titanium nitride layer 204. Intrinsic or lightly doped silicon layer 208 is deposited on heavily doped n-type layer 206. Silicon layers 208 and 206 are preferably amorphous as deposited. As in the prior example, for simplicity this example will describe the use of silicon, but it will be understood that germanium or a silicon-germanium alloy may be used instead.

Next intrinsic silicon layer 208, heavily doped n-type layer 206, titanium nitride barrier layer 204, dielectric rupture antifuse 202, and titanium nitride barrier layer 201 are patterned and etched. Within array area C, these layers are etched into pillars 300, which will be substantially cylindrical. At the edge of the array, in area D, at the end of each conductor 200, a more elongate shape 210 is formed instead, as shown. The minimum feature size of pillars 300 (their diameter) and elongate shapes 210 (their width, perpendicular to the dimension shown) is about 0.25 micron or less, for example 0.13 micron, 0.065 micron, 0.045 micron, or less. A dielectric material such as high-density plasma (HDP) oxide 211 is deposited over and between the etched features, filling gaps between them. A planarization step, for example by CMP, exposes intrinsic silicon layer 208 at a substantially planar surface in both areas C and D. The structure at this point is shown in FIG. 6a.

Figure 6B:
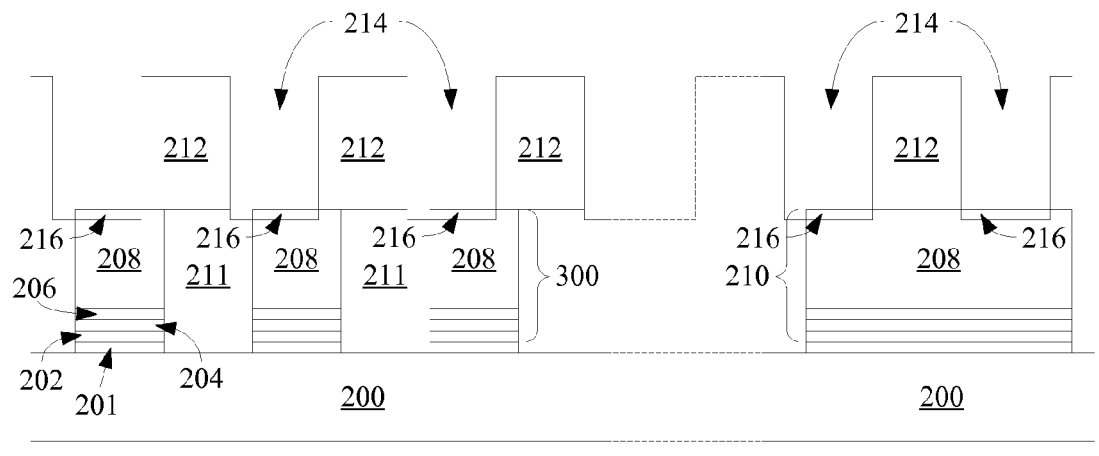

Turning to FIG. 6b, next a thickness of dielectric material 212 is deposited, and trenches 214 etched in dielectric material 212. Trenches 214 are preferably substantially perpendicular to conductors 200, and are shown in FIG. 6b in cross-section extending out of the page. Within area C, each trench 214 ideally aligns with one of the pillars 300; some misalignment likely will occur and can be tolerated. In area D, at the edge of the array, two trenches 214 will contact elongate shape 210. An ion implantation step is performed, forming heavily doped p-type regions 216. In array area C, each pillar 300 is now a vertically oriented p-i-n diode, having bottom heavily doped n-type region 206, intrinsic region 208, and top heavily doped p-type region 216. In area D, each elongate shape 210 now includes two heavily doped p-type regions 216, which will ultimately serve as the emitter and collector of the bipolar junction transistor to be formed.

Figure 6C:
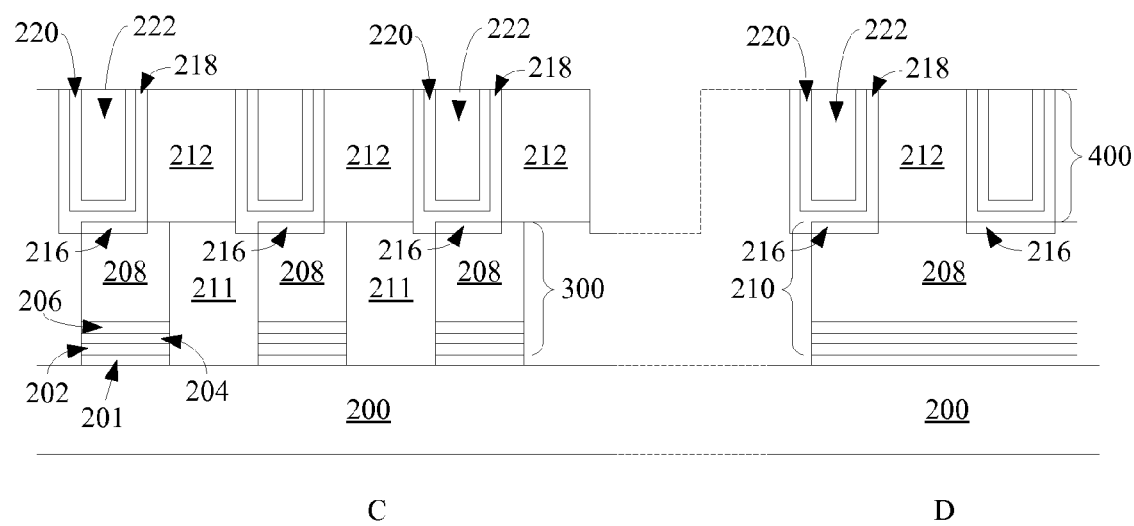

Turning to FIG. 6c, trenches 214 are filled with titanium layer 218, and other appropriate conductive material, for example titanium nitride layer 220 and tungsten layer 222. A CMP step to remove overfill of the conductive layers forms top conductors 400, which preferably extend substantially perpendicular to bottom conductors 200. A rapid thermal anneal is performed to react titanium layer 218 with the silicon of heavily doped p-type regions 216, forming titanium silicide. This anneal also crystallizes the silicon of regions 216, 208, and 206 in pillars 300 and elongate shapes 210. Note that the titanium silicide (not shown) formed where titanium layer 218 contacted silicon regions 216 will be predominantly or entirely C49 phase titanium silicide, as the feature size of pillars 300 and elongate shapes 210 is very small. Thus this titanium silicide will provide a template during crystallization of the silicon of pillars 300 and elongate shapes 210, and this silicon will have few defects and large grain size.

By applying appropriate voltages, the dielectric rupture antifuse 202 of the elongate regions 210 can be ruptured, for example in the factory before delivery to the end user. Each elongate region 210 is a bipolar junction transistor, with heavily doped p-type regions 216 serving as emitter and collector, and intrinsic region 208 serving as the base. The base is the current-switching region of a bipolar junction transistor.

Fabrication of a first memory level monolithically formed above a substrate has been described. Additional memory levels can be monolithically formed above the first memory level.

The examples described herein have included transistors used in monolithic three dimensional memory arrays. As will be clear to those skilled in the art, however, the methods and devices described herein are in no way limited to use in stacked monolithic structures or to memory arrays.

Detailed methods of fabrication have been described herein, but any other methods that form the same structures can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method for forming a current switching region in a thin film transistor, the method comprising:
   forming a feature, said feature comprising a layer of amorphous silicon, amorphous germanium, or amorphous silicon-germanium, wherein said layer has a width in at least one dimension of about 0.25 microns or less;
   forming a titanium film on and in contact with said feature;
   annealing said feature and said titanium film to form titanium silicide, titanium germanide, or titanium silicide-germanide and to crystallize said layer of amorphous silicon, said amorphous germanium, or said amorphous silicon-germanium of said feature to form polycrystalline silicon, polycrystalline germanium, or polycrystalline silicon-germanium; and
   forming the thin film transistor, wherein said polycrystalline silicon feature, said polycrystalline germanium feature, or said polycrystalline silicon-germanium feature comprises the current switching region of the thin film transistor.

2. The method of claim 1 wherein the current switching region is a channel for a field effect transistor.

3. The method of claim 2 wherein the field effect transistor is a nonvolatile memory cell comprising a charge storage region.

4. The method of claim 3 wherein the charge storage region is a floating gate.

5. The method of claim 3 wherein the charge storage region comprises a dielectric layer.

6. The method of claim 2 further comprising completely removing the titanium silicide, titanium germanide, or titanium silicide-germanide from said feature.

7. The method of claim 1 wherein the current-switching region is a base for a bipolar junction transistor.

8. The method of claim 1 wherein said feature is formed above a semiconductor substrate.

9. The method of claim 8 wherein said semiconductor substrate is silicon.

10. The method of claim 1 wherein said feature is formed above a substrate of silicon-on-insulator, glass, metal, or plastic.

11. The method of claim 1 wherein said titanium silicide is predominantly C49 phase titanium silicide.

12. The method of claim 1 wherein the crystallization of said amorphous silicon, said amorphous germanium, or said amorphous silicon-germanium of said feature is performed at a temperature between about 550 and about 850 degrees C.

13. The method of claim 12 wherein the crystallization of said amorphous silicon, said amorphous germanium, or said amorphous silicon-germanium of said feature is performed at a temperature between about 700 and about 750 degrees C.

14. The method of claim 13 wherein the crystallization of said amorphous silicon, said amorphous germanium, or said amorphous silicon-germanium of said feature is performed at a temperature of approximately 725 degrees C.

15. The method of claim 1 further comprising forming a protective film overlying said titanium film.

16. The method of claim 15 wherein said protective film is titanium nitride.

17. The method of claim 1 wherein the annealing step to form titanium silicide, titanium germanide, or titanium silicide-germanide and the annealing step to crystallize the amorphous silicon, amorphous germanium, or amorphous silicon-germanium are the same annealing step.

18. A method for forming a monolithic three dimensional array, the method comprising:
 a) monolithically forming a first device level of thin film transistors above a substrate, the thin film transistors formed by a method comprising:
  i) forming a plurality of features comprising amorphous silicon, amorphous germanium, or amorphous silicon-germanium, each of said features having a width in at least one dimension of no more than about 0.25 microns;
  ii) forming a titanium film on and in contact with each of said features;
  iii) annealing said features and said titanium film to form titanium silicide, titanium germanide, or titanium silicide-germanide and to crystallize said amorphous silicon, said amorphous germanium, or said amorphous silicon-germanium of said features to form polycrystalline silicon, polycrystalline germanium, or polycrystalline silicon-germanium; and
  iv) forming the thin film transistors of the first device level, wherein each of said polycrystalline silicon features, said polycrystalline germanium features, or said polycrystalline silicon-germanium features comprises a current-switching region for one of the thin film transistors; and
 b) monolithically forming a second device level of thin film transistors above the first device level.

19. The method of claim 18 wherein each of the current-switching regions is a channel for a field effect transistor.

20. The method of claim 19 wherein, the each of the field effect transistors is a nonvolatile memory cell having a charge storage region.

21. The method of claim 20 wherein, for at least one of the nonvolatile memory cells, the charge storage region is a floating gate.

22. The method of claim 20 wherein, for at least one of the nonvolatile memory cells, the charge storage region comprises a dielectric layer.

23. The method of claim 18 wherein said substrate comprises a semiconductor, glass, metal, or plastic.

24. The method of claim 18 wherein said titanium silicide, titanium germanide, or titanium silicide-germanide is predominantly C49 phase titanium silicide, titanium germanide, or titanium silicide-germanide.

25. The method of claim 18 wherein the crystallization of said amorphous silicon, said amorphous germanium, or said amorphous silicon-germanium of said features is performed at a temperature between about 550 and about 850 degrees C.

26. The method of claim 25 wherein the crystallization of said amorphous silicon, said amorphous germanium, or said amorphous silicon-germanium of said feature is performed at a temperature between about 700 and about 750 degrees C.

27. The method of claim 26 wherein the crystallization of said amorphous silicon, said amorphous germanium, or said amorphous silicon-germanium of said feature is performed at a temperature of approximately 725 degrees C.

28. The method of claim 18 further comprising forming a protective film overlying said titanium film.

29. The method of claim 28 wherein said protective film is titanium nitride.

30. The method of claim 18 wherein the annealing step to form titanium silicide, titanium germanide, or titanium silicide-germanide and the annealing step to crystallize the amorphous silicon, amorphous germanium, or amorphous silicon-germanium are the same annealing step.

* * * * *